United States Patent [19]

Myers

[11] Patent Number: 5,606,581

[45] Date of Patent: Feb. 25, 1997

[54] METHOD AND APPARATUS FOR THE CANCELLATION OF INTERFERENCE IN ELECTRICAL SYSTEMS

[76] Inventor: Glen A. Myers, 279 Laurles Grade Rd., Salinas, Calif. 93908

[21] Appl. No.: 214,378

[22] Filed: Mar. 17, 1994

[51] Int. Cl.$^6$ .............. H03D 3/00; H03D 3/02; H03D 1/00; H03D 1/04

[52] U.S. Cl. .......... 375/346; 375/340; 375/348; 375/371; 375/373; 375/375; 375/376; 329/301; 329/302; 329/345; 329/346

[58] Field of Search ..................... 375/222, 258, 375/346, 340, 348, 371, 373, 375, 376; 370/32.1; 379/93, 3, 410; 333/151; 329/300, 301, 302, 345, 346; 455/205, 208, 209

[56] References Cited

U.S. PATENT DOCUMENTS

| | | |
|---|---|---|
| 3,226,646 | 5/1962 | Ludwig . |
| 3,710,261 | 1/1973 | Low . |
| 3,733,565 | 5/1973 | Pierret . |
| 3,737,578 | 6/1973 | Matsuo . |
| 3,753,123 | 8/1973 | Carpenter et al. . |
| 3,831,096 | 8/1974 | Brown, Jr. . |
| 4,027,264 | 5/1977 | Gutleber ............................ 328/167 |
| 4,042,884 | 8/1977 | Querry . |
| 4,453,137 | 6/1984 | Rittenbach . |
| 4,739,518 | 4/1988 | Bickley et al. . |
| 4,783,843 | 11/1988 | Leff et al. . |
| 4,783,848 | 11/1988 | Ma et al. . |
| 4,859,958 | 8/1989 | Myers . |
| 4,984,778 | 1/1991 | Bhopale . |
| 4,992,747 | 2/1991 | Myers . |
| 5,001,747 | 3/1991 | Sexton ................................. 379/410 |
| 5,007,047 | 4/1991 | Sridhar ............................... 370/32.1 |
| 5,022,024 | 6/1991 | Paneth ................................ 375/280 |
| 5,038,115 | 8/1991 | Myers et al. . |
| 5,189,664 | 2/1993 | Cheng ................................. 379/410 |
| 5,353,348 | 10/1994 | Sendyk ................................ 379/410 |
| 5,418,778 | 5/1995 | Cummisky ........................ 370/32.1 |

Primary Examiner—Wellington Chin
Assistant Examiner—Vijay Shankar
Attorney, Agent, or Firm—LaRiviere, Grubman & Payne

[57] ABSTRACT

A cancellation circuit is provided where one demodulator circuit provides a demodulated output having interference voltage owing to interference between carrier signals, between a carrier signal and noise, or a combination of both. Cancellation of interference is particularly directed to narrowband applications. Because the interference is within the band of the desired signal, it cannot be filtered without materially harming the quality of the message. A separation circuit is provided for removing the interference voltage component from the message signal. Outputs are provided to a second demodulator for creating a phase-shifted near replica signal of the dominant carrier signal without an interference voltage component. The separation circuit includes an isolation circuit. Further described are applications of the cancellation circuit, including demultiplexing a power-multiplexed signal, demodulation of two or more carrier signals, and removal of interference from modulated and unmodulated carrier signals.

24 Claims, 8 Drawing Sheets

Phasor Diagram Representing The Sum Of Three Sinusoids

METHOD AND APPARATUS FOR THE CANCELLATION OF INTERFERENCE IN ELECTRICAL SYSTEMS

This invention was made with Government support under Prime Contract Number DAAB10-92-C-0056 awarded by the United States Army, Intelligence and Electronic Warfare Directorate, Vint Hill Farm Station, Warrenton, Va. The Government has certain rights in this invention.

TECHNICAL FIELD

The present invention generally relates to cancellation of interference in electrical circuits. It should be understood that interference includes noise, additive voltages (e.g., other carriers) and a combination of both noise and additive carriers. More specifically, the present invention relates to removal of effects of interference on sinusoidal signals in electrical circuits.

BACKGROUND ART

Operation of electrical circuits is limited by interference. Thus, interference precludes optimal performance. Applications affected by interference are widely known and include signal conversion, amplification, measurement, and demodulation.

As is known, one approach to reducing effects of interference includes the use of one or more filters. These filters typically are electrical or electromechanical. However, filtering can only significantly diminish frequency components of interference outside the passband of a signal (or signals) of interest. Moreover, filters often distort the signal of interest within the passband. Nonetheless, filtering remains the accepted practice for reducing the effects of noise and other interference.

Another approach to reducing the effects of interference is averaging. In averaging, several sample values or records of a voltage are obtained. These several measurements are then averaged. Unfortunately, the benefits of averaging may not be realized in real time. Moreover, this provides only an average value of the signal of interest, which may not sufficiently accurately correspond to the actual signal of interest. Lastly, if the mean value of the interference is not zero and is unknown, then the resolved signal, the average value of the signal of interest, is biased by the non-zero mean value of the interference.

Another approach to reducing the effects of interference is correlation. Correlation is also an averaging process. Consequently, the degree of interference reduction depends on the averaging time allowable for the application. Cancellation of interference in real-time is not possible using correlation. As correlation requires a priori knowledge of the signal to be effective, correlation is primarily used in signal detection applications, e.g., determining the presence or absence of a signal of known structure.

Due to the limitations of filtering, averaging, and correlation, reducing in real-time the effects of interference in the passband of a signal is desirable.

The inventor of the present invention has U.S. Pat. Nos. 4,859,958 ("patent '958") and 4,992,747 ("U.S. Pat. No. '747"), which are both incorporated by reference as though fully set forth herein. In these patents, a means of demodulation of all of several FM carriers is described. U.S. Pat. No. 5,038,115 ("U.S. Pat. No. '115"), coinvented by the inventor of the present invention, is also incorporated by reference as though fully set forth herein. In U.S. Pat. No. '115, phase tracking of input signals is described. In one embodiment of the phase tracking circuit of U.S. Pat. No. '115, a phase tracking circuit makes use of two phase-locked loops electrically connected in a feed-forward manner.

DISCLOSURE OF INVENTION

The present invention relates to method and apparatus for effectively cancelling in-band interference in real time.

In accordance with the present invention, a cancellation circuit is provided wherein one demodulator circuit produces an output with an interference effect. A beat isolation circuit is used to isolate and process the effect of interference, and another demodulator circuit is used to cancel the effect of interference. The remaining signal is the dominant carrier essentially free of interference effects. The present invention provides removal of the effect of interference from a carrier signal.

Also provided are system implementations of the cancellation circuit of the present invention. Specifically, in accordance with the present invention, systems having multiple stage circuits are described. The systems according to the present invention enhance Power Multiplexing®[1] capability, particularly in the case of narrow band modulated carriers. In addition, the present invention provides removal of "phase noise" from an unmodulated carrier.

[1] Power Multiplexing® is a registered trademark of Dr. Glen A. Myers.

The present invention is useful in all applications where precise knowledge of frequency of a sinusoidal signal is important. Such applications include frequency synthesizers (sources) and systems which rely on accurate values of doppler frequency (shift). Additionally, the present invention provides extension of the threshold effect of demodulators of very narrowband FM carriers where the peak frequency deviation of the carrier is much less than the bandwidth of the message. Such applications include voice and data transmission in narrowband channels. Additionally, the present invention is operable in real time. No averaging is required. The effects of interference are cancelled as they occur.

Therefore, the present invention provides a circuit which removes from a dominant carrier the effects of interference. The dominant carrier may be unmodulated or modulated. Interference may be due to:

(a) a subdominant carrier without modulation;

(b) a subdominant carrier with modulation of any kind;

(c) sums of subdominant carriers like those of (a) and/or (b);

(d) noise; or (e) combinations of noise plus subdominant carrier(s) like those of (a), (b), and (c).

Other features of the present invention are disclosed or apparent in the section entitled: "BEST MODE FOR CARRYING OUT THE INVENTION."

BRIEF DESCRIPTION OF DRAWINGS

For fuller understanding of the present invention, reference is made to the accompanying drawing in the following detailed description of the Best Mode of Carrying Out the Invention. In the drawing.

Figure 1:
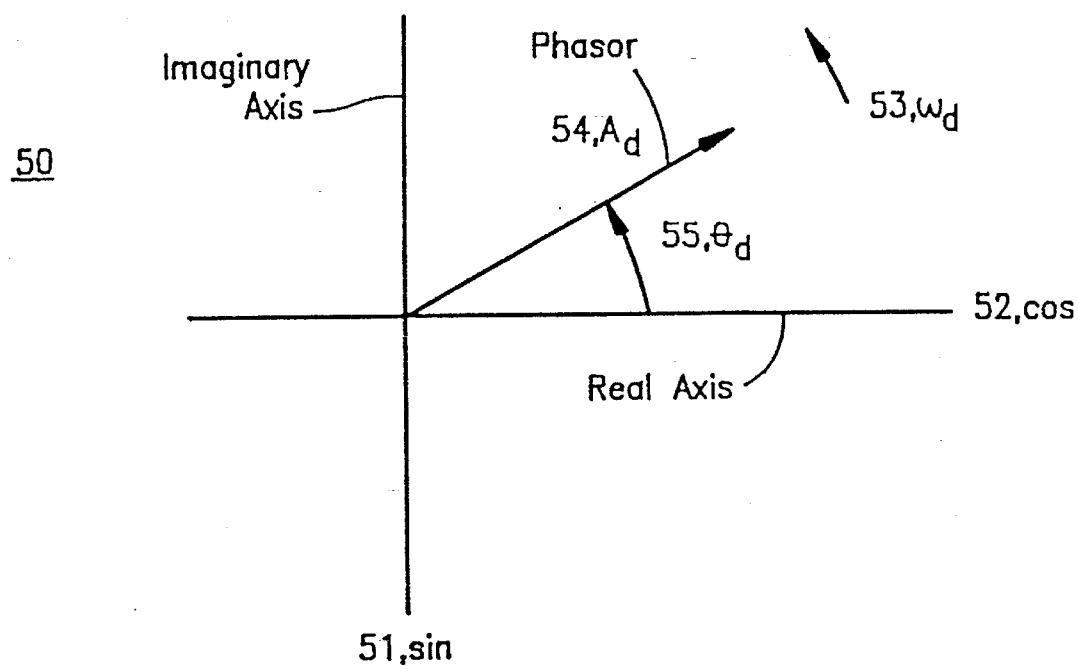
FIG. 1 is a phasor diagram.

Reference numbers refer to the same or equivalent parts of the present invention throughout the several figures of the drawing.

BEST MODE FOR CARRYING OUT THE PRESENT INVENTION

Signal Interference

In order to appreciate the present invention, a fundamental understanding of signal interference is required. In most cases a weaker sinusoidal signal interferes with a stronger sinusoidal signal. Typically, the interference is additive. The sum result may be described mathematically as a single sinusoid having both amplitude variations (or amplitude modulation (AM)) and phase variations (or phase modulation (PM)). Even in simple cases, for example unmodulated component sinusoids, mathematical expressions for AM and PM are complicated. When modulation is added to either the weaker or stronger sinusoid, the mathematical equations provide little insight into the time variation of amplitude, phase, or frequency (time derivative of phase) of the composite carrier created by the sum of the sinusoids.

It is important to understand the effect the presence of one sinusoid has on one or more of the parameters (amplitude, phase, or frequency) of another sinusoid.

In the case of sinusoids (bandpass signals), a geometric representation may be used to describe amplitude, phase, and frequency. Such a geometric presentation is referred to as a phasor diagram. A phasor diagram may be used to represent voltage $v(t)=A\cos(2\pi f_o t)$ of a sinusoid signal at some instant of time $t=t_o$. The phase of $v(t)$ is $\theta=2\pi f_o t$. It should be understood that t has dimensions of time in seconds, $f_o$ has dimensions of frequency in hertz (Hz), and A has dimensions of amplitude in volts.

As shown in FIG. 1, sinusoidal signal $V_d(t)$ is represented in the form of phasor diagram 50 at time t equal to $t_o$. Axis of abscissa 52 is denoted as the cosine function, and axis of ordinate 51 is denoted as the sine function. The notation subscript d is used to indicate a dominant signal. Therefore, for dominant signal $v_d(t)$ at time t, equal to $t_o$: $\theta_d$ indicates the phase; $A_d$ indicates the amplitude; and $\omega_d$ indicates the radian frequency. It should be understood that $\omega$ has dimensions of radians per second, and should not be confused with $\omega$ as angular velocity in rotating mechanical systems. Moreover, it should be understood that $\omega_d$ may be thought of in terms of $f_d$, where $\omega_d=2\pi f_d$.

In FIG. 1, if $v_d(t)$ has AM, then $A_d$ varies with time. If $v_d(t)$ has PM, then $\theta_d$ includes additional phase change with time imposed by the phase modulating signal. FM may be determined as an additional change in rate of rotation of a phasor imposed by frequency modulation on a signal, namely, where frequency $f_d$ is the time derivative of $\theta_d$.

Figure 2:
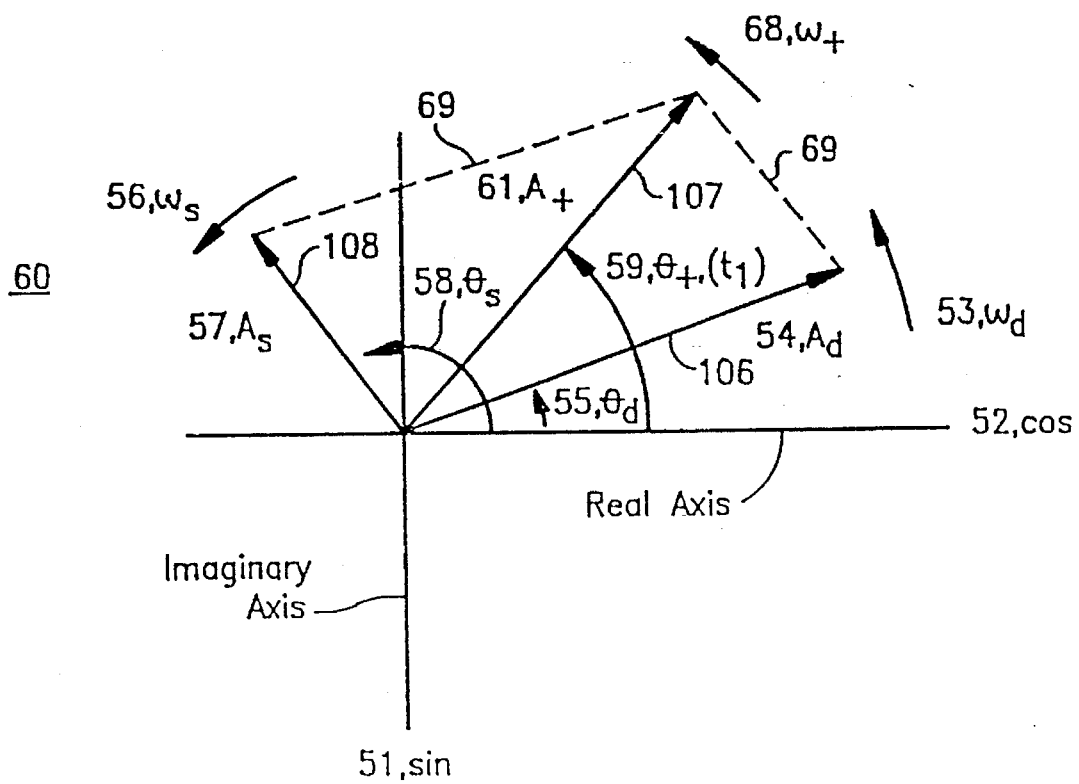
FIG. 2 is a phasor diagram of the sum of two sinusoidal signals (sinusoids)

A feature of the phasor diagram is use of vector addition to reveal results of adding two or more sinusoids. FIG. 2 shows phasor $v_+(t_o)=v_d(t_o)+v_s(t_o)$, where $v_d(t)=A_d\cos(2\pi f_d t)$ and $v_s(t)=A_s\cos(2\pi f_s t)$. Subscript s is used to denote the subdominant sinusoid, e.g., $v_s(t)$, $A_s$, and $f_s$ are the subdominant sinusoidal signal voltage, amplitude, and frequency components, respectively. If $A_d>A_s$, then the above convention is correct. However, if $A_d<A_s$, then $v_s(t)$ is the dominate sinusoid and $v_d(t)$ is the subdominant sinusoid.

Time variations of extreme values of $v_+(t)$ indicate AM and may be represented at time $t=t_1$, by phasor 107, as shown in FIG. 2. Time variations of $v_+(t)$ of its PM are represented by $\theta_+(t_1)$. The subscript + is used to denote the sum value of two or more phasors. Phasor addition of phasors 106 and 108 forms phasor 107, as indicated by dashed lines 69. Phasor 106 comprises phase $\theta_d$ 55, amplitude $A_d$ 54, and frequency $\omega_d$ 53. Phasor 108 comprises phase $\theta_s$ 58, amplitude $A_s$ 57, and frequency $\omega_s$ 56. Phasor 107 comprises phase $\theta_+(t)$ 59, amplitude $A_+$ 61, and frequency $\omega_+$ 68.

Frequency Beat Voltage

Variation of $A_+$ is commonly referred to as the "beat" associated with the addition of two sinusoids. This beat voltage occurs in amplitude demodulator outputs. Frequency $f_b$ of beat voltage $A_+(t)$ is given by the relation: $f_b=f_s-f_d$ Hz. Less typical are beat variations of $\theta_+(t)$ and $(1/2\pi)[d\theta_+(t)/dt]$, which appear as voltages at outputs of phase and frequency demodulators, respectively. Circuits involving effects of a weak FM carrier on a strong FM carrier, e.g., interference suppression, FM capture effect, multipath, and power multiplexing, involve beat variations of phase and frequency.

Figure 3:
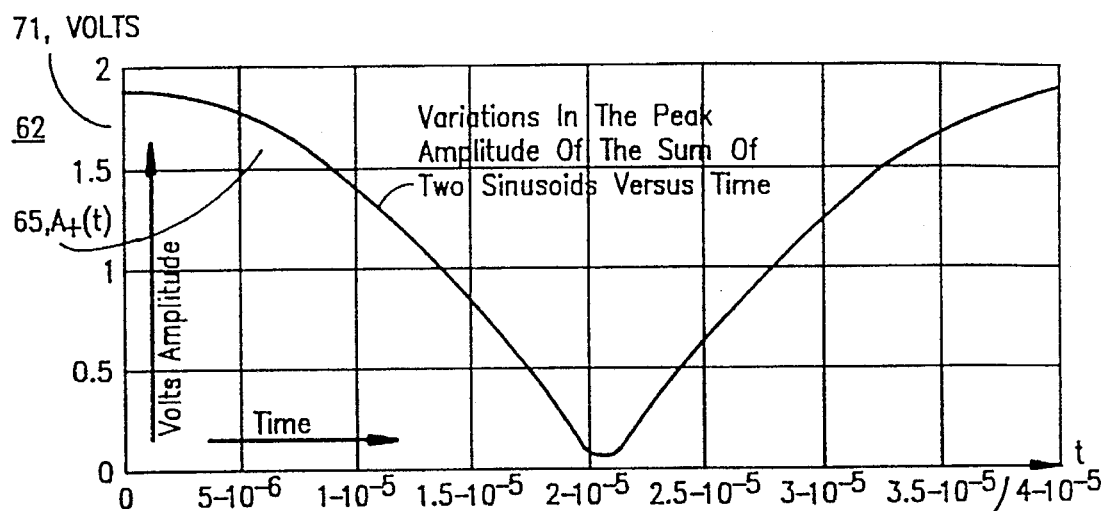
FIG. 3 is a plot of variations in time of the peak amplitude of a voltage which is the sum of two sinusoids.
Figure 4:
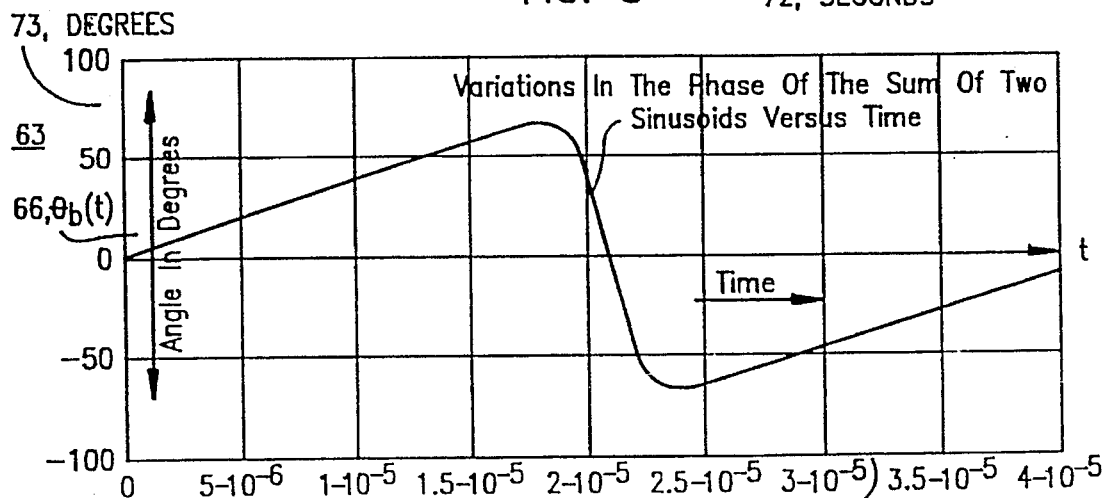
FIG. 4 is a plot of phase variations in time of a voltage which is the sum of two sinusoids.
Figure 5:
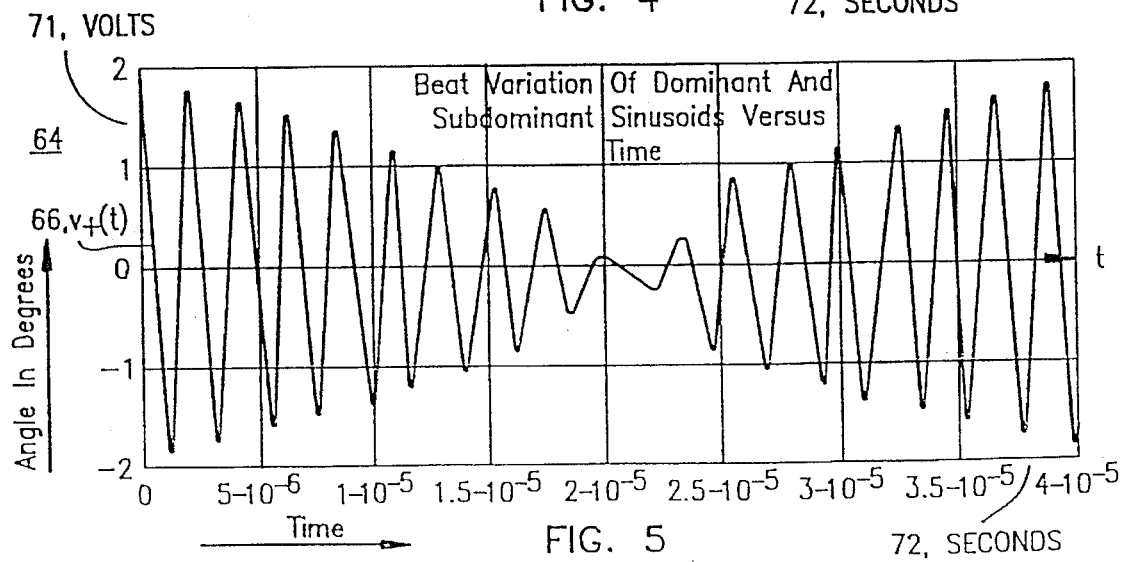
FIG. 5 is a plot of a sum voltage of a dominant and subdominant sinusoids.

Referring to FIGS. 3, 4, and 5, time variation of $A_+(t)$, $\theta_b(t)$, and $v_+(t)$ are shown. These graphs were developed by plotting the following trigonometric identities where $r=A_d/A_s$:

$$A_+(t)=A_d[1+r^2+2r\cos(2\pi f_b t)]^{1/2}; \text{ and} \qquad (1)$$

$$\theta_b(t)=\arcsin[A_s\sin(2\pi f_b t)/A_+(t)] \qquad (2)$$

where $\theta_b(t)$ is the beat variation of $\theta_+(t)$. That is, $\theta_b(t)=\theta_+(t)-2\pi f_d t$.

Proper choice of values of t used to create a phasor diagram provides a clear indication of AM and PM imposed on a dominant sinusoid by the presence (addition) of a weaker sinusoid.

The method according to the present invention is to draw the phasor diagram for those values of time for which the dominant sinusoid phasor lies on the axis of the abscissa, e.g., cosine axis 52. This is tantamount to using the dominant sinusoid as a reference. With $v_d(t)$ as a reference and with phasor addition, the phasor representing $v_+(t)$ is the locus of points illustratively shown by dash circle 74 of FIG. 6.

Center 70 of circle 74 is the point along axis of abscissa 52 to which $A_d$ 54 extends. This is the amplitude (in volts) of phasor 106 from intersection, origin 109, of cosine and sine axes 52 and 51. Radius 57 of circle 74 is $A_s$ 57, namely, amplitude (in volts) of phasor 108 of the subdominant sinusoid. Phasor 108 completes a revolution in a time interval of $T_b=1/f_b$, where $T_b$ has dimensions of seconds. If $f_s>f_d$, then phasor 108 rotates counterclockwise according to mathematical convention. However, if $f_s<f_d$, then phasor 108 rotates clockwise.

Figure 6:
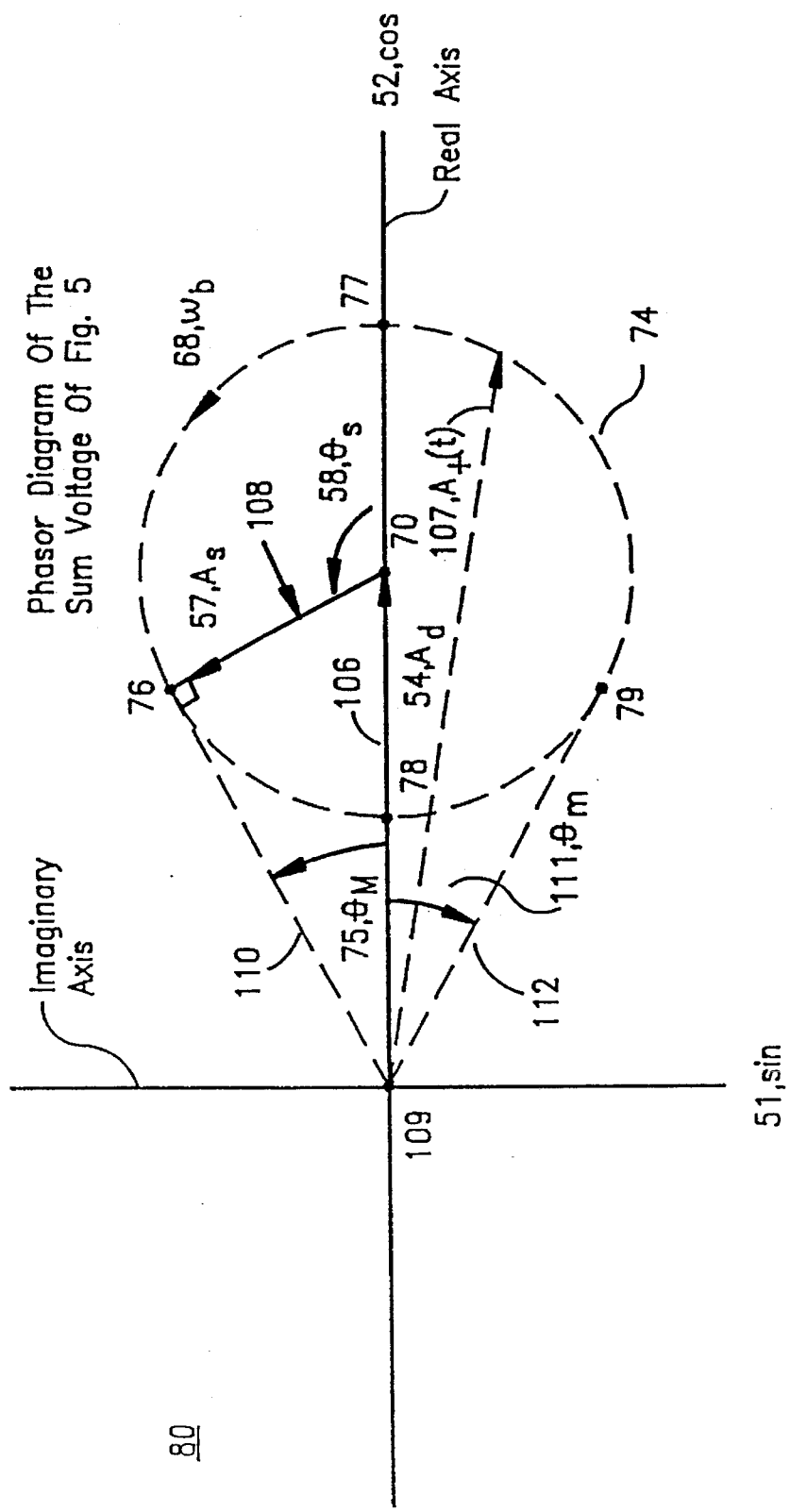
FIG. 6 is a phasor diagram of the sum voltage of FIG. 5.

Referring to FIG. 6, there are several important observations which may directly apply to power multiplexing and interference cancellation. These observations are as follows:

1. The maximum value of $A_+(t)$ is $A_d+A_s$, namely, point 77 on axis of abscissa 52. It should be understood that point 77 corresponds to constructive interference of two sinusoids represented by phasors 106 and 108.

2. The minimum value of $A_+(t)$ is $A_d-A_s$, namely, point 78 on axis of abscissa 52. It should be understood that point 78 corresponds to destructive interference of two sinusoids represented by phasors 106 and 108.

3. There is no shift in phase of $v_+(t)$ relative to $v_d(t)$ at the minimum and maximum values of E(t).

4. The phase departure of $v_+(t)$ from $v_d(t)$ is $\theta_+(t)-2\pi f_d t = \theta_b(t)$, as previously defined. The maximum value of $\theta_b(t)$ is $$\theta_M = \arcsin(A_s/A_d) = \arcsin(1/r) \quad (3)$$

$\theta_M$ is geometrically located on FIG. 6 by dashed line 110 from origin 109 to tangent 79 point 76 to circle 74. The same geometrical method may be used to locate the minimum value of phase departure 111 $\theta_m(=-\theta_M)$ with line 112 (see observations 5 and 6 below).

5. If $\theta_b(t)$ is the phase of $v_+(t)$ relative to $v_d(t)$, then $\theta_b(t)$ is symmetrical about zero degrees. Therefore, $\theta_b(t)$ is an odd function.

6. If $f_s<f_d$, locus of points, e.g., dashed circle 74, moves clockwise and $\theta_b(t)$ becomes $-\theta_b(t)$.

Figure 7:
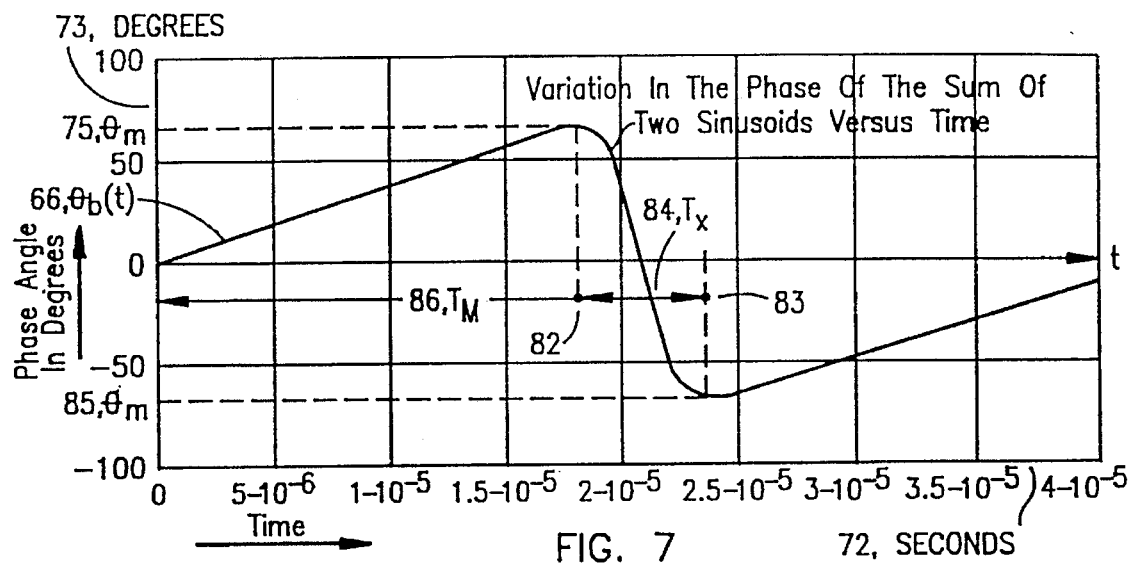
FIG. 7 is a plot of a phase relationship between the sum voltage and the dominant carrier signal voltage.

Referring to FIG. 7, plot 63 of FIG. 4 of $\theta_b(t)$ 66 is repeated. Time $T_x$ 84 is the time needed for the relative phase of $v_d(t)$ to go from a maximum value $\theta_M$ 75 to a minimum value $-\theta_M$ 85. Time $T_x$ 84 is the time to move from point 82 to point 83, corresponding to locations 76 and 79, respectively, of FIG. 6. Time $T_x$ 84 may be determined from FIG. 7 and is determined from the equation:

$$T_x = 2T_b[(90°-\theta_M)/360°] = T_b[(90°-\theta_M)/180°] \quad (4)$$

Time $T_M$ 86 of FIG. 7 may also be determined. Time $2T_M$ for the relative phase to go from minimum value $-\theta_m$ 85 to maximum value $\theta_M$ 75 may be determined from the equation:

$$2T_M = T_b - T_x = T_b[1-(90°-\theta_M)/180°] = T_b(90°+\theta_M)/180° \quad (5)$$

Several conclusions may be formed regarding an output of a frequency demodulator having an input $v_+(t)$. It should be apparent from FIG. 6 that the rate of phase change (added frequency variation) increases with $f_b$. In the region from point 83 to point 82, this rate also increases with r, where r is the ratio of carrier amplitudes, e.g., as previously stated.

Figure 8:
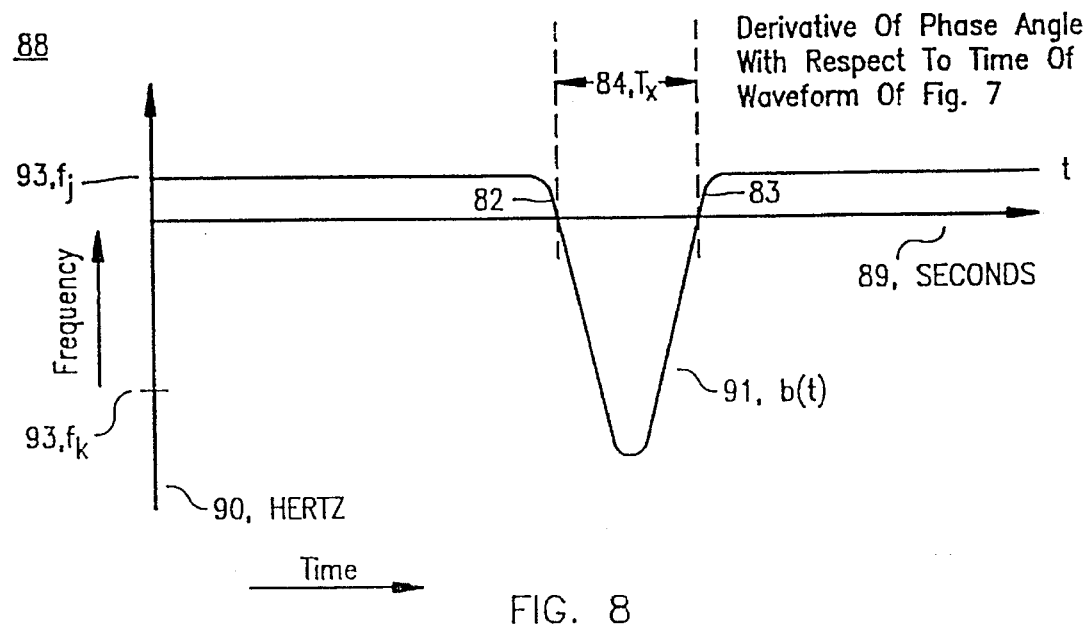
FIG. 8 is a plot of an approximate normalized rate of change in phase which is a "beat" voltage.

As $\theta_b(t)$ 81 is obtained from FIG. 7, the derivative in terms of time, $d\theta_b(t)/dt$, may be graphically constructed as shown in FIG. 8.

Referring to FIG. 8, plot 88 is of frequency, axis of ordinate 90, versus time, axis of abscissa 89, where frequency variation b(t) 91 is the derivative $(1/2\pi)d\theta_b(t)/dt$. For part of each "beat" cycle, the phase changes by $2\theta_M$ (or $\theta_M-\theta_m=\theta_M-(-\theta_M)$) degrees in $2T_M$ seconds for an average rate of approximately $\theta_M/T_M$ degrees per second or $(\theta_M/T_M)$ (1 cycle/360) in terms of cycles per second or hertz. This equation may be reduced to an equation for principal beat frequency $f_j$ 92:

$$\theta_M/[T_b(90°+\theta_M)]=\theta_M f_b/(90°+\theta_M)=f_j \quad (6)$$

For a small part of each "beat" cycle, the phase changes by $2\theta_M$ degrees in $T_x$ seconds. An average rate of change for 274 $_M$ is non-principal beat frequency $f_k$ 93, which is approximately:

$$2\theta_M/(T_x \cdot 360°)=\theta_M/180° \cdot T_x=\theta_M/[T_b(90°-\theta_M)]=\theta_M f_b/(90°-\theta_M)=f_k \quad (7)$$

Phase $\theta_b(t)$ 81 is created by the subdominant carrier. Since the dominant carrier has been used as a reference, the total phase variation of $v_+(t)$ is that of the dominant carrier plus $\theta_b(t)$ 81. Hence, the output of a frequency demodulator having $v_+(t)$ as an input is the message of the dominant carrier (FM carrier assumed) plus a voltage variation (frequency beat voltage b(t) 91) like that shown in FIG. 8. If $f_s<f_d$, the voltage shown in FIG. 8 is inverted. It should be understood that frequency beat voltage b(t) 91 observed at the output of a frequency demodulator is the voltage shown in FIG. 8, provided lowpass or baseband filtering does not cause attenuation and/or distortion.

The representation shown in FIG. 7 may also be used for AM, PM, or FM carriers. With AM, the length of the phasor changes with time. This causes $\theta_M$ to vary with time. This is referred to as AM to PM conversion. With FM or PM, $f_b$ is the difference in values of instantaneous frequency of the two carriers, and hence varies with time. This difference in the values of instantaneous frequency creates modulation of parameters $T_b$, $T_x$, $T_M$, $f_j$, and $f_k$. In which case, a dynamic beat voltage appears as part of the output of a frequency demodulator. FIG. 6 provides a simple, visual means of predicting this dynamic "beat effect" with AM, PM, or FM on either one or both carriers.

Figure 9:
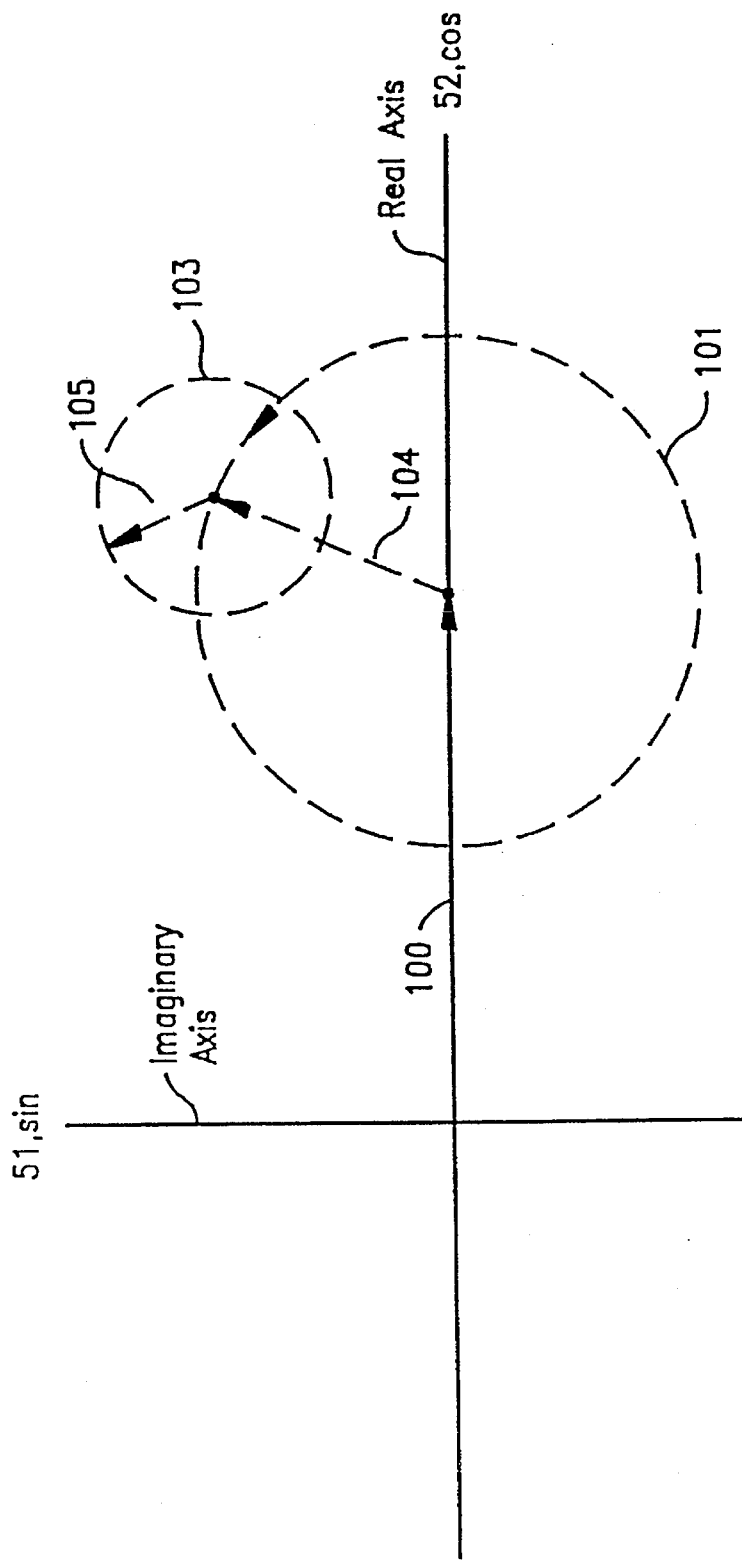
FIG. 9 is a phasor diagram representing the sum of three sinusoids (carrier signals)

The locus of points for three or more carriers can also be represented in a manner like that of FIG. 6. FIG. 9 is provided as a representation of three carriers represented as phasors 100, 104, and 105. The locus of points for resulting values of $v_+(t)$ for addition of phasors 100 to 104 to 105 is represented by dashed circles 101 and 103. Obviously the form of $\theta_b(t)$ becomes much less predictable with the addition of each carrier.

Power Multiplexing®

Wave forms of FIGS. 7 and 8 are applicable to Power Multiplexing® using the phase tracking circuit described in U.S. Pat. No. '115. The presence of frequency beat voltage b(t) superimposed on message voltage $m_d(t)$ of a FM dominant carrier signal prevented Power Multiplexing® operation in narrowband applications. Narrowband applications include situations where two or more carriers have small frequency deviation due to their respective messages (modulating voltages). In narrowband applications, frequency components of beat voltage b(t) lie in the passband of message voltage $m_d(t)$. Hence, beat voltage b(t) may not be removed by filtering without also removing all or part of message $m_d(t)$. The present invention provides use of voltage addition to remove unwanted beat voltage b(t).

In accordance with the present invention, improvement of the phase tracking circuit of patent '115 allows for removal from a dominant carrier phase effects created by one or more subdominant carriers. Thus, a more accurate replica of the dominant carrier results for either narrowband or wideband applications. In Power Multiplexing® operation, as described in patents '958, '747, and '115, improved replica signals result in better cancellation of the dominant carrier. This creates as a remainder subdominant carriers which may be further demodulated in accordance with the present invention.

Figure 10:
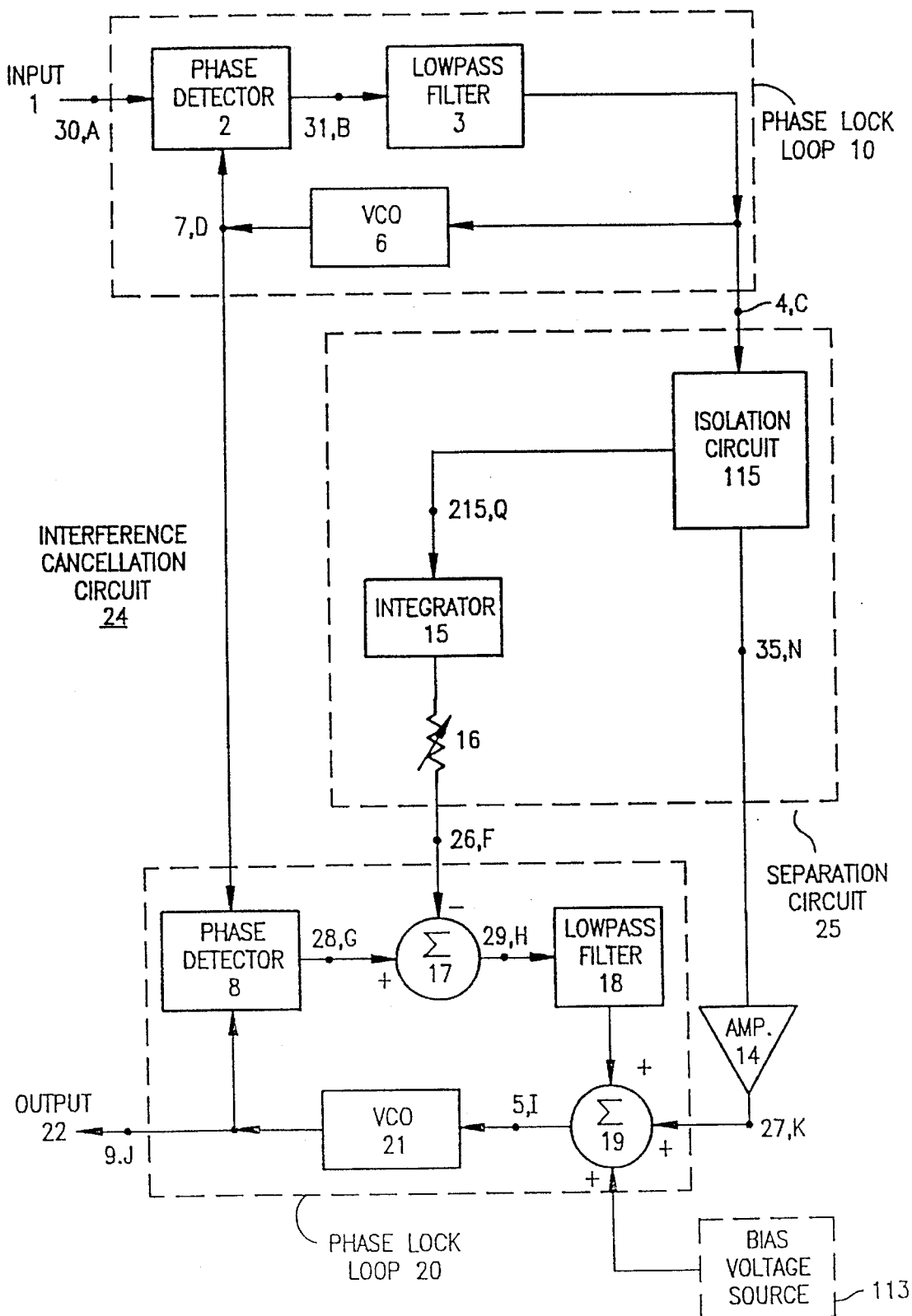
FIG. 10 is a block diagram of one embodiment of a noise/interference cancellation circuit in accordance with the present invention.

Referring to FIG. 10, interference cancellation circuit 24 of the present invention is shown in block diagram form. It should be understood that phase-locked loops, e.g., loops 10 and 20, convert time variation of frequency of an input sinusoid to like time variations of voltage. Phase-locked loops 10 and 20, therefore, function as frequency demodulators. Information is provided to circuit 24 via input 1 to phase detector 2. Phase detector 2 is an element of phase-locked loop 10. Operation of phase-locked loops is described in U.S. Patents previously incorporated herein by reference.

Sum of Two Sinusoids as Input Without Modulation on Dominant Carrier

For an input 1 of an FM sinusoid having a dominant and subdominant carrier, where the dominant carrier has no modulation, input at node 30, location A, equals:

$$A_d \cos [2\pi f_d t] + A_s \cos [2\pi f_s t + a(t)] \quad (8)$$

The subdominant carrier is an arbitrary FM signal. Thus, in equation (8), $\alpha(t)$ is arbitrary and is determined by the message and the type of modulation. It should be understood that $\alpha(t)$ may represent an analog or digital signal. The subdominant carrier interferes with the dominant carrier, e.g., according to the diagram of FIG. 6. The result at node 4, location C, is frequency beat voltage b(t), where:

$$b(t) = (\frac{1}{2}\pi)[d\theta_b(t)/dt] \quad (9)$$

Frequency beat voltage b(t) has the form shown in FIG. 8. Voltage-controlled oscillator (VCO) 6 is a frequency modulator. Since a loop lock condition requires voltage frequency at node 7, location D, to equal that of input 1 voltage at node 30, location A, then voltage $v_D(t)$ at node 7 when in loop lock condition is:

$$v_D(t) = V_D \cos \left[ 2\pi f_d t + \int_0^t b(z)dz \right] \quad (10)$$

In equation 10, $V_D$ is a constant, and $v_D(t)$ is not a replica of the dominant carrier signal of input 1. However, the present invention provides at node 9, location J, a near replica of the input dominant carrier signal. Assuming a replica of the dominant carrier signal of input 1 is achieved at node 9, voltage $v_G(t)$ at node 28, location G, of phase detector 8 is proportional to the difference in phase of the dominant and subdominant carriers at the output of phase detector 8 and at node 9. Therefore, $v_G(t)$ is:

$$v_G(t) = k_\phi \int_0^t b(z)dz \quad (11)$$

where $k_\phi$ is a proportionality constant of phase detector 8.

When the dominant carrier is unmodulated, then only b(t) exists at node 4, location C. In which case, $v_F(t)$ is made equal to $v_G(t)$ of equation (11) by electrically connecting node 4 to node 215, location Q, and using integrator circuit 15. Thus, message recovery circuit 11 is an open circuit and voltage $v_N(t)$ at node 35, location N is set to zero (e.g., connected to a ground reference).

Frequency beat voltage b(t) must be integrated to provide a voltage for addition with voltage $v_G(t)$ at node 28, location G. Integrator circuit 15 may be a resistor-capacitor (R-C) circuit. Optionally, integrator circuit 15 may be an operational amplifier (op-amp) circuit. Although, the op-amp circuit is more complicated than a R-C circuit. Alternatively, integrator circuit 15 may be any of a variety of well-known integrator circuits. Therefore, voltage $v_F(t)$ at node 26, location F, is of the form $$k_{\phi F} \int_0^t b(z)dz \quad (12)$$

By subtracting voltage $v_F(t)$ at node 26, location F, from $v_G(t)$, using potentiometer 16 to adjust amplitude for proportionality constant $k_\phi$ equal to $K_{\phi F}$ such that $v_F(t)$ equals $v_G(t)$, beat frequency voltage components may be removed with summer (differencing circuit) 17. As a consequence no beat frequency voltage b(t) would be present at node 29, location H. Thus, voltage $v_H(t)$ at node 29 would be zero. As there is no modulation on the dominant carrier, i.e., no message, voltage $v_I(t)$ at node 5, location I, is zero. Consequently, no modulation of the dominant carrier appears at node 9, location J, and output 22 is a replica of the unmodulated dominant carrier signal of input 1 absent interference.

Moreover, message recovery circuit 11 is an open circuit, and voltage $v_N(t)$ at node 35, location N, is set to zero (e.g., connected to ground).

It should further be understood that noise, n(t), may exist in input 1. In which case, $n_i(t)$, for input noise, must be added to equation (8). Output at node 4 will then include noise, $n_o(t)$, including some proportionality constant, since noise $n_i(t)$ will effect phase modulation yielding a voltage at node 4. Output noise, $n_o(t)$, will be treated by circuit 24 just as b(t) is treated, namely, $n_o(t)$ will be isolated by isolation circuit 115 and provided to summer 17, after integration, for cancellation with noise $n_G(t)$ in $V_G(t)$.

Therefore, it should be understood that the present invention may be used for removal of b(t), when present, and $n_o(t)$, when present, at node 4. In order to avoid confusion, while enabling those skilled in the art to practice the claimed invention, this specification omits many details regarding the removal of $n_o(t)$. However, b(t) may represent n(t) or a combination of n(t) plus b(t), and thus, all the information regarding removal noise n(t) is disclosed herein.

Sum of Two Sinusoids as Input with Modulation on Both Carriers

For an input 1, having a dominant carrier and one or more subdominant carriers, where modulation is on the dominant carrier, input 1 for the dominant carrier at node 30, location A, is:

$$A_d \cos \left[ 2\pi f_d t + \int_0^t m_d(z)dz \right] \quad (13)$$

For the dominant portion of input 1, phase-locked loop 10 has an output at node 4, location C, of $km_d(t)$, where k is a proportionality constant. As the subdominant carrier(s) interfere with the dominant carrier as previously described, then phase-locked loop 10 output at node 4 is $k[m_d(t)+b(t)]$, where $m_d(t)$ is due to frequency modulation of the dominant carrier signal, i.e., the message, and k is a proportionality constant related to signal and phase-locked loop 10 parameters. Proportionality constants depend on the type of hardware employed. As previously discussed, b(t) is the frequency beat voltage created by the additive presence of at least one subdominant carrier signal. In cases where b(t) may be removed by filtering without compromising message $m_d(t)$ at node 4, location C, of phase-locked loop 10, the demodulator (receiver), is said to exhibit "capture." The result is typically referred to as "FM capture effect." However, these applications, where filtering may be used to remove b(t), do not include in-band interference. Specifically, narrowband applications are precluded.

In accordance with the present invention, the procedure is to isolate frequency beat voltage b(t) caused by interference, where b(t) is of a proper amplitude, and to form:

$$\int_0^t b(z)dz \quad (14)$$

As frequency beat voltage b(t) is to be subtracted from $v_G(t)$, it is necessary to isolate beat voltage b(t) at node 215, location Q.

When the dominant carrier frequency is modulated by message voltage $m_d(t)$, voltage $v_c(t)$ at node 4 is $k[m_d(t)+b(t)]$. The function of isolation circuit 115 is to isolate $km_d(t)$ from $v_c(t)$. The nature of isolation circuit 115 depends on the form of $m_d(t)$. A priori knowledge of $m_d(t)$ and of carrier power separation may be used in development of isolation circuit 115.

i. Subtractor Circuit Embodiment

Figure 13:
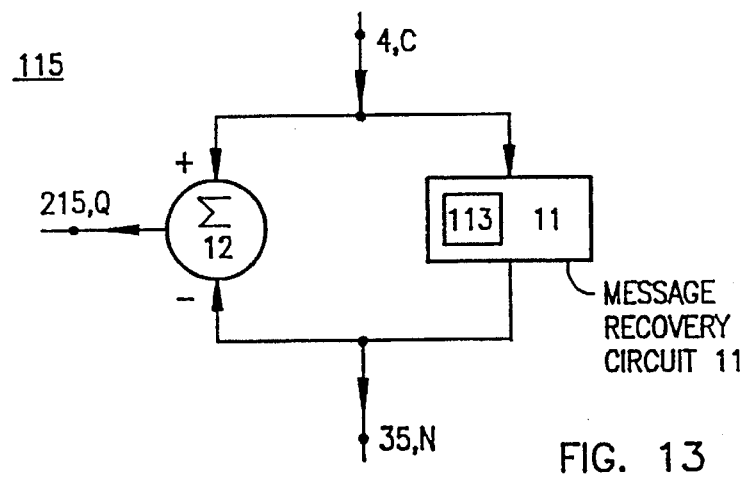
FIGS. 13–15 are block diagrams of embodiments of isolation circuits in accordance with the present invention.

Referring to FIG. 13, one embodiment of isolation circuit 115, as shown in block diagram form, is provided for when $m_d(t)$ is a two-level voltage (bit stream) with the carriers appropriately separated in amplitude. A limiter, e.g., hard limiter 113, may be used for message recovery circuit 11 to isolate $km_d(t)$. As voltage $v_c(t)$ is provided to message recovery circuit 11, voltage $v_N(t)$ at node 35, location N, is approximately equal to $km_d(t)$. Hence, isolations of beat voltage kb(t) at node 115, location Q, may be realized by applying voltage $v_c(t)$ at node 4, location C, and voltage $v_N(t)$ at node 35, location N, to differencing circuit 12. Voltage $v_N(t)$ is also provided to lowpass filter 13, amplifier 14, and summer 19, which are described in U.S. Pat. No. '115 incorporated herein by reference.

Isolation circuit 115, as shown in FIG. 13, is but one form of a circuit for isolation of interference from message. Other isolation circuits are possible. Indeed, the nature of the modulation and a priori knowledge of the message may result in a variety of circuits to isolate b(t) from m(t).

ii. Multiplier Circuit Embodiment

Figure 14:
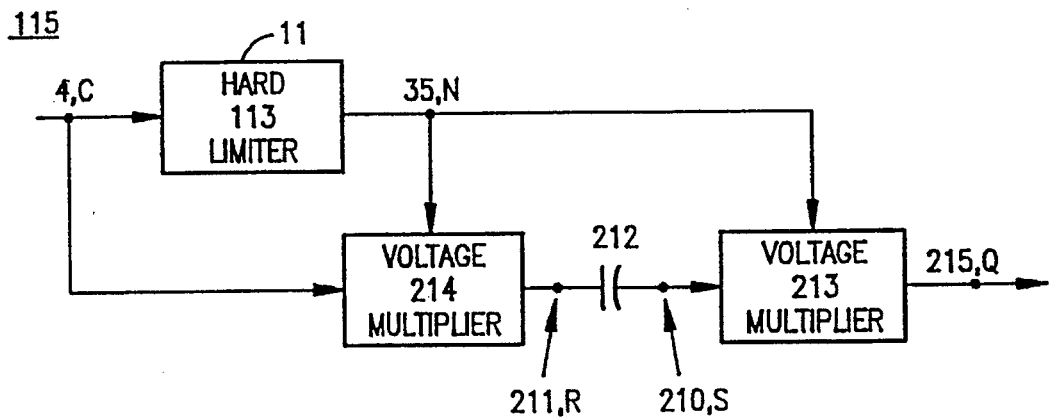

Referring to FIG. 14, another embodiment of isolation circuit 115, as shown in block diagram form, is provided for when $m_d(t)$ is a two-level voltage (bit stream) having values of ±V volts. In which case, voltage at node 4 is $k[\pm V+b(t)]$. Voltage at node 35 may be set to ±1 volt with hard limiter 113. Analog voltage multipliers 213 and 214 have outputs which are equal to the product of their inputs. Hence, voltage $v_R(t)$ at node 211, location R, is $k[V+b(t)]$. Coupling capacitor 212 removes DC voltage leaving voltage $v_s(t)$ at node 210, location S, equal to ±b(t). Multiplication by ±1 volt using multiplier 213 provides kb(t) at node 215.

iii. Amplifier Circuit Embodiment

Figure 15:
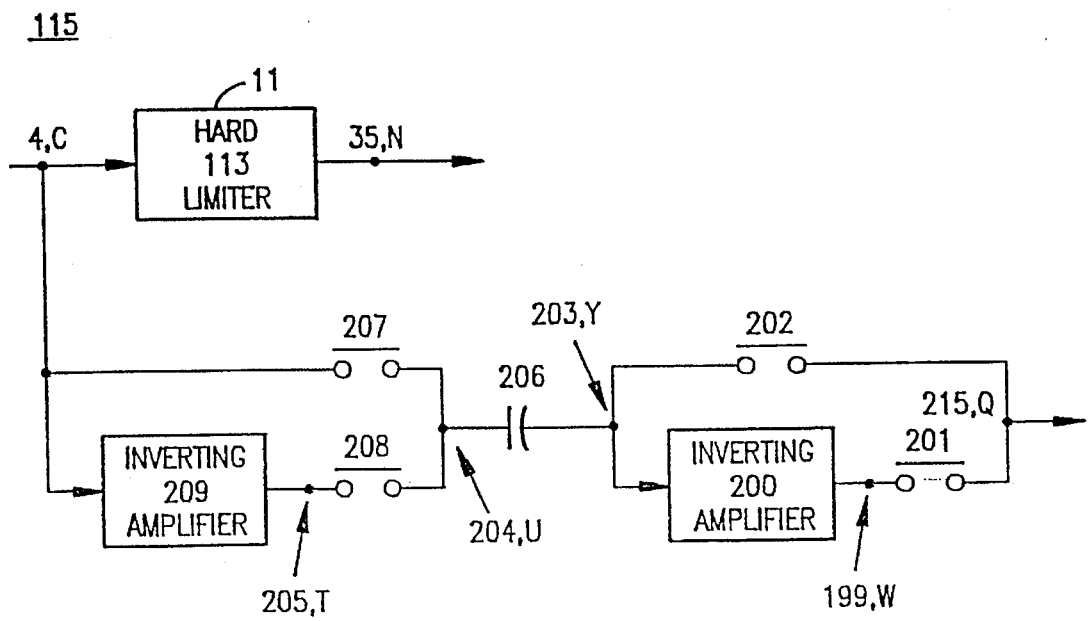

Referring to FIG. 15, a preferred embodiment of isolation circuit 115, as shown in block diagram form, is provided for when $m_d(t)$ provided to hard limiter 113 results in a two-level digital output, at node 35, having "High" and "Low" voltage values. Hard limiter 113 output at node 35 operates electrically controlled switches 201, 202, 207, and 208. To avoid confusion, while enabling those skilled in the art to practice the present invention, wiring of switches 201, 202, 207, and 208 to node 35 is omitted. It should further be understood that switches 201, 202, 207, and 208 may be in the form of transistors, electro-mechanical switches, relays, or other well-known means for electrically controlled switching. In an application of the preferred embodiment, a 4066 integrated circuit was used for switches 201, 202, 207, and 208.

When voltage at node 35 is High, switches 207 and 202 are closed and switches 208 and 201 are open. When voltage at node 35 is Low, switches 207 and 202 are open and switches 208 and 201 are closed.

Inverting amplifiers 209 and 200 have unity-gain, with voltage $v_c(t)$ at node 4, location C, equal to $k[V+b(t)]$ (High), voltage at node 204, location U, is $k[V+b(t)]$. Coupling capacitor 206 removes DC voltage leaving kb(t) at nodes 203 and 215. With voltage $v_c(t)$ equal to $k[-V+b(t)]$ (Low), voltage at nodes 205 and 204 is $k[V-b(t)]$. Coupling capacitor 206 removes DC voltage leaving -kb(t) at node 203, location Y. When switch 202 is open and switch 201 is closed, voltage at node 203 is -kb(t). Hence, voltage at nodes 201 and 215 is kb(t). When voltage at node 35 is High, switch 202 is closed and switch 201 is open. In which case, voltage at nodes 203 and 215 is kb(t).

Since output at node 4 is $k[m_d(t)+b(t)]$, then, because of the operation of VCO 6, voltage $V_D(t)$ at node 7, location D, is $$V_d \cos\left[2\pi f_d t + \int_0^t m_d(z)dz + \int_0^t b(z)dz\right] \quad (15)$$

If the output at node 9, location J, is to have the form of equation (12), namely, a replica of the dominant carrier, then voltages at node 5, location I, and at node 29, location H, must be proportional to $m_d(t)$. Under this condition, voltage $v_G(t)$ at node 28, location G, has the form:

$$v_G(t) = k_\phi\left[m_d(t) + \int_0^t b(z)dz\right] \quad (16)$$

Output from phase detector 8, $v_G(t)$ at node 28, location G, may be added to voltage $v_F(t)$ at node 26, location F, using summer (differencing circuit) 17 to provide cancellation of the interference voltage component of $v_G(t)$. Potentiometer 16 is provided for adjusting amplitude of $v_F(t)$ for equating to amplitude of $v_G(t)$ for cancellation, as previously described herein, where potentiometer 16 is adjusted to make $k_\phi$ equal $k_{\phi F}$. Thus, output of summer 17, voltage $v_H(t)$ at note 29, location H, has no interference voltage component.

Voltage $v_N(t)$ at node 35, location N, is passed through amplifier 14 to provide voltage $v_K(t)$ at node 27, location K. Typically, $v_K(t)$ will be approximately $2m_d(t)$ and $v_H(t)$ will be approximately $-m_d(t)$. This is part of the phase tracking circuit Power Multiplexing® operation described in U.S. Pat. No. '115. Voltage $v_K(t)$ is added to voltage $v_H(t)$ with summer 19. Voltage $v_I(t)$ at node 5, location I, will therefore be approximately $m_d(t)$. Optionally, bias voltage source 113 may be used to adjust for phase tracking, as described in U.S. Pat. No. '115. Bias voltage source 113 may optionally be coupled to summer 19 for adjusting for phase tracking. With the inclusion of voltage $v_K(t)$ at node 27, location K, voltage $v_H(t)$ at node 29 is the inverse of dominant message $m_d(t)$ without interference, which is passed through filter 18 to summer 19.

Interference has been removed from the signal at node 29. Also, message $m_d(t)$ has been isolated from interference at node 35 and is still isolated at node 27. Consequently, phase-locked loop 20 operates as described in U.S. Pat. No. '115.

The result is a replica of the dominant voltage at node 9, location J, having the form:

$$v_J(t) = -V_j\cos\left[2\pi f_d t + \int_0^t m_d(z)dz\right] \quad (17)$$

$V_j$ is a constant related to amplitude, which may be adjusted (e.g., with potentiometer 40 shown in FIG. 11) for correspondence to $A_d$ of equation (13).

In the case of two sinusoids with modulation on both carriers and input noise, input 1 is of the form:

$$A_d \cos \left[ 2\pi f_d t + \int_0^t m_d(z) dz \right] + \tag{18}$$

$$A_s \cos \left[ 2\pi f_s t + \int_0^t m_s(z) dz \right] + n_i(t)$$

Figure 11:
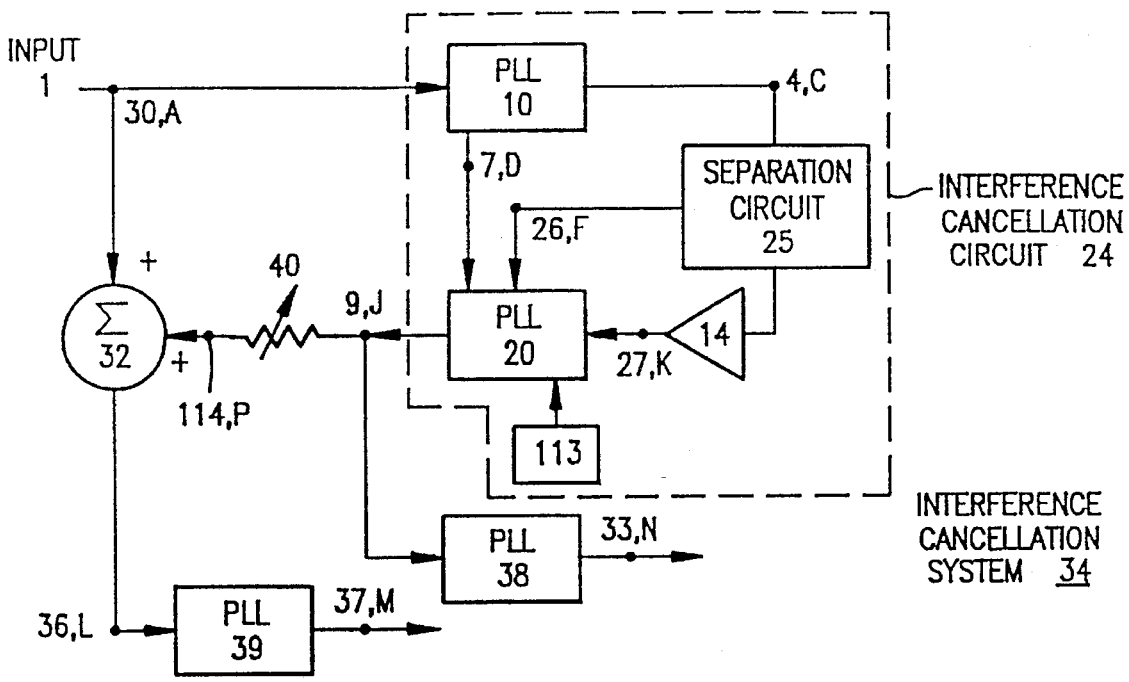
FIGS. 11 and 12 are block diagrams of systems implementations of the circuit of FIG. 10 in accordance with the present invention.

A result of combining voltages of equations (17) and (18) using summer 32 (as shown in FIG. 11) is removal of the dominant carrier from input 1 to provide subsequent demodulation of one or more subdominant carriers which realizes power multiplexing operation.

While only two examples of input 1 have been described, it should be understood that other types of inputs may be used without departing from the spirit and scope of the present invention.

Removal of Incidental FM Caused by Noise

It should be understood that natural noise when added to a sinusoid creates "incidental" AM and FM in that sinusoidal signal. Circuit 24 of FIG. 10 may be used to remove incidental FM or "phase noise" from a sinusoid contaminated with noise. This is accomplished in the same manner in which frequency beat, interference voltage b(t) is removed from a sinusoid. When phase-locked loop 10 has only noise voltage $n_o(t)$ at node 4, then node 4, location C, is electrically connected to node 215, location Q. Phase-locked loop 20 and separation circuit 25 are configured to cancel the effect of noise n(t) in the same manner that b(t) was cancelled. Thus, a sinusoid free of noise is obtained at node 9, location J.

Systems

The extent and nature of FM and PM on a carrier are difficult to determine with conventional electronic instrumentation such as oscilloscopes and spectrum analyzers. Therefore, referring to FIG. 11, interference cancellation system 34, is shown. In system 34, additional phase-locked loop 38 may be coupled to node 9 to translate carrier argument or angle variations into like voltages for observation on an oscilloscope, characterization a spectrum analyzer, or measuring with a voltmeter. Phase-locked loop 38 serves as a frequency demodulator to convert frequency variations of the carrier at node 9 to corresponding voltage variations at node 33, location K. From the voltage at node 33, it may be determined or observed if and under what circuit conditions a replica of the dominant carrier exists at node 9.

Summer 32 may be used to cancel the dominant carrier, leaving the subdominant carrier at node 36, location L. Frequency demodulator phase-locked loop 39, may be used to recover message $m_s(t)$ at node 33, location M, from the subdominant carrier. In this manner, Power Multiplexing® capability is achieved whereby messages on the dominant and subdominant carriers appear at nodes 33 and 37, respectively. Notably, if only two carriers are involved, there will be no beat interference from the dominant carrier at node 36. Thus, there will be no beat frequency voltage to be removed. However, if more subdominant carriers are involved, this would not be the case.

Carriers of Very Small Frequency Deviation

Typical frequency demodulators experience operating "thresholds" when the carrier peak frequency deviation is small compared with the bandwidth of the message. These thresholds are typically where the ratio of signal power to noise power is in excess of 20 decibels (dB). Threshold in this case is defined as the minimum signal-to-noise ratio (SNR) required for usable output. When carrier deviation is small, a peak voltage value of message $m_d(t)$ at node 4 in FIG. 10 is small. At some value of SNR, voltage due to noise (or, more generally, interference) at node 4 exceeds that due to signal. Under this condition the interference effect may be cancelled to a degree without cancelling the message.

For example, if a bit stream message is provided on a carrier, message recovery circuit 11 an open circuit and node 35, location N, connected to ground, then the threshold value is reduced when using interference cancellation circuit 24 of FIG. 10. For example, with a bit rate of 400 bits per second (bps) and a peak-to-peak carrier deviation of 2·Δf=150 Hz for a carrier frequency of 455 kHz, data recovery may be achieved with a SNR greater than or equal to approximately 10 dB.

In a second example, audio (voice and music) may be used as a message on a carrier provided to interference cancellation circuit 24 of FIG. 10. In which example, Δf is approximately 187 Hz. With circuit 24, good quality audio is recoverable at a SNR of approximately 10.4 dB. For purposes of comparison, when node 26 in FIG. 10 is removed from summer 17, a comparable quality audio may require a SNR of approximately 23.1 dB. Therefore, in accordance with the present invention, by incorporating separation circuit 25 between stages of phase-locked loops 10 and 20, a threshold extension of 12.7 dB for audio for very narrow band FM may be achieved.

The above examples are provided for purposes of illustration only. Other numerical values and results therefrom may be employed when practicing the art as taught by the present invention.

Demultiplexing

Figure 12:
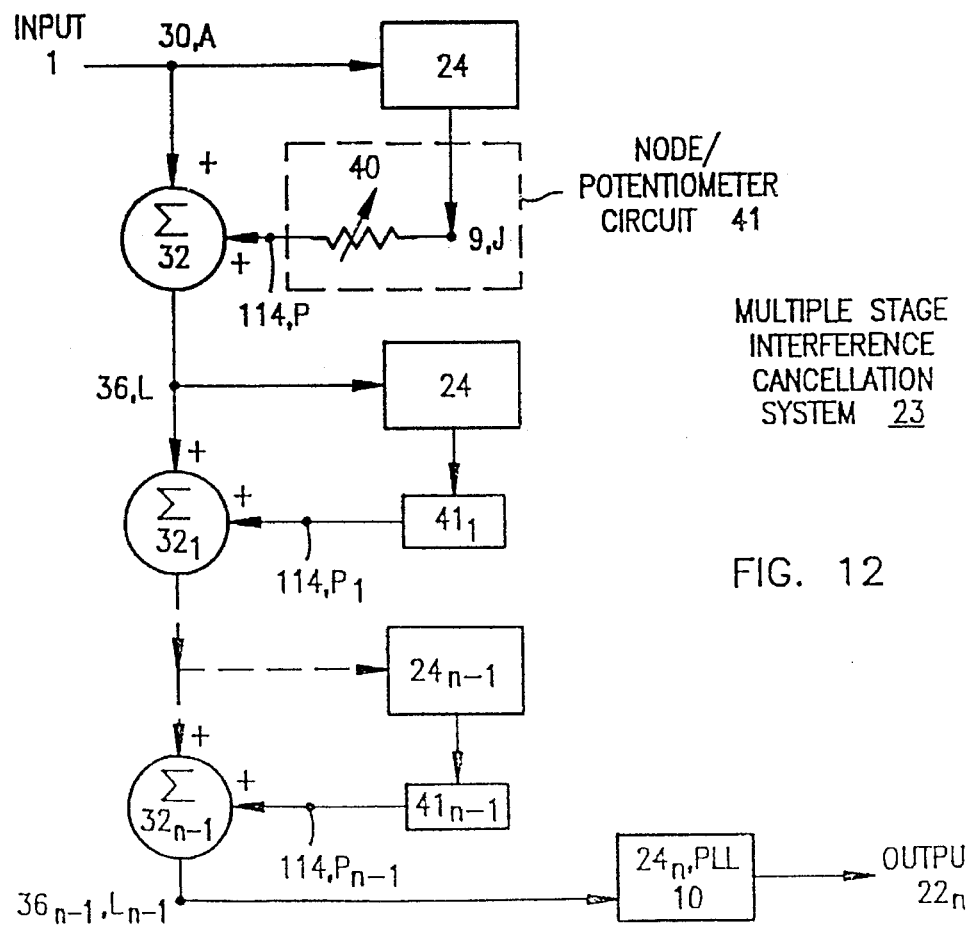

Referring to FIG. 12, multistage interference cancellation system 23 is shown. Input 1 comprises a dominant carrier and subdominant carrier signals. Input 1 is provided to summer 32 and interference cancellation circuit 24. Appearing at node 9, location J, is an approximate negative replica of the dominant carrier signal of input 1. Potentiometer 40 is used to adjust to compensate for the difference in amplitude between the negative replica and the dominant carrier signal of input 1. Thus, output at node 36, location L, of summer 32 is input 1 less the dominant carrier signal. The next dominant, the previously most powerful subdominant, is provided to interference cancellation circuit 24 and summer $32_1$. The previous process described for removing the dominant carrier signal from the input occurs again. This process continues for demodulating or Power Multiplexing® (or demultiplexing) input 1.

At summer $32_{n-1}$, output to node $36_{n-1}$, location $L_{n-1}$ is the least powerful subdominant carrier signal of input 1. As there are no other subdominant carrier signals present at this point in time, any message of this signal may be demodulated with a phase-locked loop 10 to provide output $22_n$. Or, alternatively, if there is some concern as to whether there is still noise n(t) present in the least powerful subdominant, interference cancellation circuit $24_n$ may be employed to provide output $22_n$ to remove any remaining noise interference n(t).

In accordance with the present invention, it should be understood that an input signal having a plurality of carrier signals may be demodulated for recovery of any message on each carrier signal. In the process of demodulating for any message on each of the carrier signals, each input signal is also demultiplexed according to signal power for each of the plurality of carrier signals. Alternatively, this may be thought of as Power Multiplexing® in the sense that a plurality of carrier signals at various power levels may be provided at node 30 and sequentially demodulated according to power level to demultiplex one or more input signals comprising one or more carrier signals.

The present invention has been particularly shown and described with respect to certain preferred embodiments and features thereof. However, it should be readily apparent to those of ordinary skill in the art that various changes and modifications in form and detail may be made without departing from the spirit and scope of the inventions as set forth in the appended claims. The inventions illustratively disclosed herein may be practiced without any element which is not specifically disclosed herein.

I claim:

1. Apparatus for cancelling interference comprising:

a first demodulator coupled for receiving an input signal and for providing a first output and a second output, the second output being a voltage to frequency conversion of the first output, the first demodulator including a first modulator for converting the first output to provide the second output;

a separation circuit coupled to the first demodulator for receiving the first output, the separation circuit including an isolation circuit for isolating interference in the first output, the separation circuit for providing a third output and an isolated interference output; and a second demodulator coupled to the first demodulator for receiving the second output and coupled to the separation circuit for receiving the third output and the isolated interference output, the second demodulator for cancelling an interference component of the second output signal using the isolated interference output for providing an intermediate signal, the second demodulator for combining the third output with the intermediate signal to provide a fourth output, the fourth output being a phase-shifted, near replica of the input signal, the near replica of the input signal having approximately none of the interference, the second demodulator including a second modulator for providing a voltage to frequency conversion of the near replica of the input signal.

2. The apparatus of claim 1 wherein the isolated interference output comprises beat voltage.

3. The apparatus of claim 1 wherein the isolated interference output comprises noise voltage.

4. The apparatus of claim 1 wherein the input signal is an unmodulated carrier signal.

5. The apparatus of claim 1 wherein the input signal is a modulated carrier signal, and wherein the apparatus further comprises an amplifier.

6. The apparatus of claim 5 wherein the third output comprises an approximation of a message signal, and wherein the amplifier is coupled for amplifying the approximation of the message signal.

7. The apparatus of claim 1 wherein the first output comprises beat voltage and noise voltage.

8. The apparatus of claim 7 wherein the first output further comprises a message signal, and wherein the apparatus further comprises an amplifier coupled for amplifying the third output.

9. The apparatus of claim 8 wherein the input signal comprises a plurality of carrier signals, and wherein:

the message signal is recovered by demodulating a dominant carrier signal of the plurality of carrier signals;

the beat voltage is caused by at least one other carrier signal of the plurality of carrier signals; and the fourth output is a phase-shifted, near replica of the dominant carrier signal approximately absent beat voltage and noise voltage.

10. The apparatus of claim 1 wherein the interference is in-band.

11. The apparatus of claim 10 wherein the interference is cancelled in real-time.

12. Apparatus for cancelling in-band interference comprising:

a first frequency demodulator coupled for receiving an input signal, the input signal comprising a plurality of carrier signals, the carrier signals comprising a dominant signal and at least one subdominant signal, the first frequency demodulator for providing a first output and a second output, the first frequency demodulator including a modulator for voltage to frequency conversion of the first output to provide the second output;

a separation circuit coupled for receiving the first output, the separation circuit including an isolation circuit coupled for receiving the first output, the isolation circuit for isolating interference from any message voltage on the dominant signal, the separation circuit for providing an isolated interference output and a first message voltage approximation output; and a second frequency demodulator coupled for receiving the second output, the first message voltage approximation output and the isolated interference output, the second frequency demodulator for phase demodulation of the second output to provide a phase-detected second output and for removing an interference component of the phase-detected second output using the isolated interference output, the second frequency demodulator for adding the first message voltage approximation output to the phase-detected second output less the interference component for providing a second message voltage approximation output, the second frequency demodulator for voltage-to-frequency conversion of the second message voltage approximation output to provide a phase-shifted, near replica signal of the dominant signal approximately absent the interference.

13. The apparatus of claim 12 wherein the first message voltage approximation output is amplified prior to addition to the phase-detected second output less the interference component.

14. The apparatus of claim 13 wherein the separation circuit comprises an integrator circuit for integrating the interference to provide the isolated interference output.

15. The apparatus of claim 14 wherein the isolated interference output comprises beat interference voltage.

16. The apparatus of claim 14 wherein the isolated interference output comprises noise interference voltage.

17. The apparatus of claim 14 wherein the isolated interference output comprises noise interference voltage and beat interference voltage.

18. The apparatus of claim 14 wherein the isolation circuit comprises a message recovery circuit and a signal combining circuit.

19. The apparatus of claim 18 wherein the message recovery circuit comprises a hard limiter, and the signal combining circuit is a subtractor.

20. The apparatus of claim 14 wherein the isolation circuit comprises a hard limiter coupled for receiving the first output.

21. The apparatus of claim 20 wherein the isolation circuit comprise a plurality of voltage multipliers and a capacitor.

22. The apparatus of claim 20 wherein the isolation circuit comprises a plurality of switches and inverting amplifiers and a capacitor.

23. The apparatus of claim 12 wherein the first frequency demodulator and the second frequency demodulator are phase-locked loops.

24. Method for cancelling interference comprising the steps of:

receiving an input signal to a first demodulator;

receiving a first output signal from the first demodulator to a separation circuit, the separation circuit including an isolation circuit for isolating an interference voltage from any message signal in the first output signal;

receiving the second output signal from the first demodulator to a second demodulator;

receiving an approximation of any message signal and the interference voltage from the separation circuit to the second demodulator;

cancelling in the second demodulator an interference voltage component of the second output signal using the interference voltage;

providing an intermediate signal absent the interference voltage component in the second demodulator; and combining in the second demodulator the approximation of any message signal with the intermediate signal to provide a third output, the third output being a phase-shifted, near replica signal of the input signal, the near replica signal having approximately none of the interference voltage.

* * * * *